(12) United States Patent
Meynants et al.

(10) Patent No.: US 12,009,380 B2
(45) Date of Patent: Jun. 11, 2024

(54) PIXEL OF A SEMICONDUCTOR IMAGE SENSOR AND METHOD OF MANUFACTURING A PIXEL

(71) Applicant: ams Sensors Belgium BVBA, Antwerp (BE)

(72) Inventors: Guy Meynants, Antwerp (BE); Gerhard Eilmsteiner, Antwerp (BE)

(73) Assignee: AMS SENSORS BELGIUM BVBA, Antwerp (BE)

(*) Notice: Subject to any disclaimer, the term of this patent is extended or adjusted under 35 U.S.C. 154(b) by 466 days.

(21) Appl. No.: 17/416,550

(22) PCT Filed: Nov. 13, 2019

(86) PCT No.: PCT/EP2019/081202
§ 371 (c)(1),
(2) Date: Jun. 21, 2021

(87) PCT Pub. No.: WO2020/126238
PCT Pub. Date: Jun. 25, 2020

(65) Prior Publication Data
US 2022/0085089 A1    Mar. 17, 2022

(30) Foreign Application Priority Data
Dec. 21, 2018    (EP) ..................................... 18215601

(51) Int. Cl.
*H01L 27/146*    (2006.01)
(52) U.S. Cl.
CPC .... *H01L 27/14625* (2013.01); *H01L 27/1463* (2013.01); *H01L 27/14685* (2013.01)

(58) Field of Classification Search
CPC ......... H01L 27/14685; H01L 27/14643; H01L 27/14629; H01L 27/14625; H01L 27/1463; H01L 27/1464
See application file for complete search history.

(56) References Cited

U.S. PATENT DOCUMENTS 8,283,195 B2    10/2012    Meynants
8,941,198 B2 *   1/2015    Enomoto .......... H01L 27/14636
                                                257/432
(Continued)

FOREIGN PATENT DOCUMENTS

CN    102630341 A    8/2012
CN    105097856 A    11/2015
(Continued)

OTHER PUBLICATIONS

English Translation of Korean Office Action in Korean Application No. 10 2021 7022109 mailed on Nov. 17, 2022, 6 pages.
(Continued)

*Primary Examiner* — Mamadou L Diallo
(74) *Attorney, Agent, or Firm* — MH2 TECHNOLOGY LAW GROUP LLP

(57) ABSTRACT

A pixel with enhanced quantum efficiency comprises a semiconductor body that has a first surface configured as an entrance surface and a light capturing region configured for capturing light that is incident on the first surface. The pixel further comprises a structured interface, isolation layers on at least two surfaces of the semiconductor body that are perpendicular to the first surface, and a filter element that is arranged at a distance from the first surface such that light that is incident on the first surface at an angle of incidence smaller than a critical angle impinges on the filter element.

19 Claims, 6 Drawing Sheets

(56) References Cited

U.S. PATENT DOCUMENTS

| | | | |
|---|---|---|---|
| 10,224,359 B2* | 3/2019 | Pralle | ............... H01L 27/14645 |
| 2005/0040440 A1 | 2/2005 | Murakami | |
| 2006/0011955 A1 | 1/2006 | Baggenstoss | |
| 2008/0142686 A1 | 6/2008 | Konno et al. | |
| 2008/0198454 A1 | 8/2008 | Wang et al. | |
| 2009/0286346 A1 | 11/2009 | Adkisson et al. | |
| 2011/0227138 A1 | 9/2011 | Haddad et al. | |
| 2011/0290982 A1 | 12/2011 | Boutami et al. | |
| 2013/0032914 A1 | 2/2013 | Iwasaki | |
| 2013/0113964 A1 | 5/2013 | Sasaki et al. | |
| 2014/0029004 A1* | 1/2014 | Bodkin | ................ G01J 3/2823 356/328 |
| 2014/0138785 A1 | 5/2014 | Pralle | |
| 2014/0197509 A1* | 7/2014 | Haddad | ............... H01L 31/0232 257/432 |
| 2015/0015758 A1 | 1/2015 | Ikeda | |
| 2015/0340391 A1 | 11/2015 | Webster | |
| 2015/0356351 A1 | 12/2015 | Saylor et al. | |
| 2016/0225922 A1 | 8/2016 | Akkaya et al. | |
| 2017/0059754 A1 | 3/2017 | Frey et al. | |
| 2017/0276849 A1 | 9/2017 | Langner et al. | |
| 2017/0336317 A1 | 11/2017 | Tschekalinskij et al. | |
| 2018/0006072 A1* | 1/2018 | Roy | ................. H01L 27/14629 |
| 2018/0040653 A1 | 2/2018 | Toda | |
| 2018/0083057 A1* | 3/2018 | Crocherie | ......... H01L 27/14629 |
| 2018/0151759 A1 | 5/2018 | Huang et al. | |
| 2018/0337211 A1 | 11/2018 | Su et al. | |
| 2019/0103437 A1* | 4/2019 | Su | ..................... H01L 27/14627 |
| 2019/0226989 A1* | 7/2019 | Karpf | ...................... H01S 5/146 |
| 2019/0317263 A1* | 10/2019 | Han | ....................... G02B 6/005 |

FOREIGN PATENT DOCUMENTS

| | | |
|---|---|---|
| CN | 105308626 A | 2/2016 |
| CN | 107251224 A | 10/2017 |
| CN | 109155323 A * | 1/2019 ............... G02B 7/34 |
| DE | 102016208841 A1 | 11/2017 |
| EP | 2863437 A1 | 4/2015 |
| JP | 2011061133 A | 3/2011 |
| JP | 2013098503 A | 5/2013 |
| JP | 2016197733 A | 11/2016 |
| JP | 2018098344 A | 6/2018 |
| JP | 2018169388 A * | 11/2018 |
| WO | 2013142815 A1 | 9/2013 |
| WO | WO-2018042785 A1 * | 3/2018 ............. G01S 17/89 |
| WO | 2018155634 A1 | 8/2018 |
| WO | 2017126329 A1 | 11/2018 |
| WO | 2018219786 A1 | 12/2018 |
| WO | 2018092600 A1 | 10/2019 |

OTHER PUBLICATIONS

English Translation of Chinese Office Action in Chinese Application No. 201980082963.1 mailed on Apr. 23, 2023, 11 pages.

Oshiyama, I. et al.: "Near-infrared Sensitivity Enhancement of a Back-illuminated Complementary Metal Oxide Semiconductor Image Sensor with a Pyramid Surface for Diffraction Structure," Proc. IEDM, 2017, pp. 397-400.

International Search Report and Written Opinion mailed Feb. 11, 2020 for corresponding International Application No. PCT/EP2019/081202, 8 pages.

English Translation of Chinese Office Action in Chinese Application No. 201980082963.1 mailed on Sep. 15, 2023, 14 pages.

Chinese the Decision on Rejection issued in Chinese Application No. 201980082963.1 mailed on Jan. 5, 2024, with English language translation, 13 pages.

* cited by examiner

PIXEL OF A SEMICONDUCTOR IMAGE SENSOR AND METHOD OF MANUFACTURING A PIXEL

CROSS-REFERENCE TO RELATED APPLICATIONS

The present application is the national stage entry of International Patent Application No. PCT/EP2019/081202, filed on Nov. 13, 2019, and published as WO 2020/126238 A1 on Jun. 25, 2020, which claims the benefit of priority of European Patent Application No. 18215601.8, filed on Dec. 21, 2018, all of which are incorporated by reference herein in their entirety.

FIELD

The present disclosure relates to a pixel for use in semiconductor image sensors and to a method for manufacturing such a pixel.

BACKGROUND OF THE INVENTION

CMOS image sensors are used in a wide range of applications, such as for camera modules in smartphones, tablet computers, laptops, etc. Many of these applications rely on the use of active illumination, in particular by means of an LED or a laser light source such as a VCSEL. For efficient operation of an image sensor, particularly in these cases, a high quantum efficiency of the individual pixels of the image sensor is essential. For applications in the infrared band, such as 3D imaging, state of the art image sensors often suffer from low efficiency due to light escaping from the pixels without being detected, i.e. being absorbed by the active region of the pixel. In addition, further drawbacks often include high noise contributions due to unwanted background signals, as well as unnecessarily high sensitivities at a wavelength of the light other than the target wavelength of the pixel.

SUMMARY OF THE INVENTION

This disclosure provides an improved concept for a pixel of a semiconductor image sensor, which is characterized by an enhanced quantum efficiency at a target wavelength and which overcomes the disadvantages of modern image sensors.

The obvious approach of increasing the active region of a pixel by increasing a thickness of the detector material, such as an active light-capturing region of a photodiode, for example, is generally impossible to realize if at the same time small dimensions of the pixel have to be maintained in order to achieve a compact, high resolution image sensor. The improved concept, however, is based on the idea of providing an image sensor with pixels that are capable of trapping the light inside a volume of the pixel for an extended amount of time ideally until the light is eventually absorbed in the pixel's active region and therefore detected. Furthermore, a pixel according to the improved concept ensures narrowband sensitivity at at least one predetermined target wavelength and at the same time prevents noise contributions from unwanted background light at any wavelength.

In particular, a pixel according to the improved concept comprises a semiconductor body that has a first surface configured as an entrance surface and a light capturing region configured for capturing light that is incident on the first surface. The pixel further comprises a structured interface, isolation layers on at least two surfaces of the semiconductor body that are perpendicular to the first surface, and a filter element that is arranged at a distance from the first surface such that light that is incident on the first surface at an angle of incident smaller than a critical angle impinges on the filter element.

Each pixel of an image sensor is configured to capture optical information incident upon the respective pixel and to generate electrical information representative of the optical information. Especially for image sensors fabricated according to standard CMOS technologies, the working principle of the pixels is the conversion of optical intensity into a photocurrent using a photodiode. Silicon-based photodiodes comprised by the semiconductor body are a common choice in this connection, as these diodes are sensitive over a broad wavelength range between 190 nm and 1100 nm and therefore cover the relevant part of the electromagnetic spectrum in both the visible and the infrared domain. In addition, due to the large bandgap of silicon, silicon-based photodiodes show a superior noise performance compared to other photodiodes, such as germanium-based photodiodes.

The structured interface is configured to scatter incident light by realizing a light-scattering interface which is formed by a light scattering layer on a surface of the semiconductor body, for instance. For example, structures on a surface of the light scattering layer have a pyramidal shape forming the structured surface. The light scattering layer may be of the same material as a material of the semiconductor body, such as silicon, or of a different material, such as an oxide, that has a refractive index different from that of the material of the semiconductor body, for instance. Scattering of the incident light inside a pixel volume enables trapping of the light within said pixel volume by altering its propagation path.

In order to further prevent light from escaping the pixel volume before being absorbed, isolation layers are arranged on multiple surfaces of the semiconductor body. For example, side faces of a pixel, i.e. the faces perpendicular to the first surface, comprise a layer of a material, such as silicon dioxide, that has a refractive index that is different from that of the material of the semiconductor body. Light within the pixel volume that impinges on the interface created by the isolation layer with an incident angle larger than a cut-off angle is totally reflected and therefore trapped within the pixel volume. The optional small cut-off angle is predetermined and depends on the refractive indices of the semiconductor body and the isolation layer. The pixel volume is defined by the semiconductor body which is delimited by the first surface, a surface of the semiconductor body opposing the first surface, and side surfaces of the semiconductor body that are perpendicular to the first surface.

In order to also prevent light from escaping through the first surface after being reflected off of surfaces within the volume of the pixel, i.e. the interfaces formed by the light scattering interface and by the isolation layers, a filter element is arranged at a distance from the first surface. Therein the filter element is arranged outside the pixel volume as close as possible to the first surface. Furthermore, the dimensions of the filter element are selected such that all light incident at an angle of incidence smaller than a critical angle has to traverse the filter element before entering the pixel volume. The filter element is configured to transmit incident light such that the latter can impinge on the first surface and hence enter the pixel volume and to reflect light that impinges on the filter element after leaving, i.e. escaping from, the pixel volume. The filter element may therefore be regarded as an effective one-way mirror.

In some embodiments, a transmission value of the filter element depends on the angle of incidence and/or on a wavelength of the light.

As the structured interface changes the angle of reflection of the incident light as previously described, light escaping from the pixel volume will impinge on the filter element at a different angle than light impinging on the first surface when first entering the pixel volume. This way, the light entering the pixel, generally under an angle of incidence close to 0° as the pixel is typically oriented towards an object or light source that is to be imaged, is efficiently trapped by means of the interplay of the angle dependent filter element, the structured interface and the isolation layers. Alternatively or in addition, the transmission of the filter element may be wavelength dependent such that only the target wavelength is transmitted in the first place while other wavelengths are reflected.

In some further embodiments, the filter element is configured to reflect light if the angle of incidence is larger than a critical value, and to transmit light if the angle of incidence is less than or equal to the critical value.

To define a field-of-view of the pixel, in these embodiments the filter is designed to have a critical angle as a cut-off angle wherein light is only transmitted by the filter element if impinging on the filter element with the angle of incidence being smaller than the critical angle. Light incident at or above the critical angle is reflected by the filter element and therefore prevented from entering the pixel volume.

In some embodiments, the filter element comprises a dichroic filter.

Dichroic filters provide a compact solution to realize a wavelength dependent transmission of the light incident on the filter element. Also known as Bragg filter, the dichroic filter is formed by a set of alternating layers of thin films with different refractive indices. Realizing the thin film interference principle, this kind of filter enables a highly wavelength dependent transmission and hence aids in preventing unwanted light from entering the pixel through the first surface. By tuning the number, materials and thicknesses of the layers, the passband of the filter can be tuned to a specific target wavelength and designed to be as narrow or broad as desired.

In some embodiments, the pixel further comprises a waveguide structure, which is arranged between the filter element and the first surface.

In order to prevent light from escaping through the gap formed between the first surface of the semiconductor body and the filter element, a waveguide structure may be arranged within said gap such that light is confined within a pixel and cannot enter a neighboring pixel, for example. Similarly to the isolation layer and the semiconductor body, the waveguide structure may employ the principle of total internal reflection.

In some embodiments, the filter element is configured to transmit light at optical wavelengths within a specific narrowband wavelength range, in particular a wavelength range comprising 940 nm and/or 850 nm.

An advantage of infrared light in general is that it is invisible to the human eye. Therefore, even imaging processes that require high intensity active illumination can be employed without disturbing the human eye. The wavelengths of 940 nm and 850 nm are particularly relevant used in infrared imaging applications such as 3D imaging or facial recognition. The reason for this is the low intensity of sunlight at these wavelengths due to absorption in the atmosphere. Operating at these wavelengths therefore means little to no unwanted background light and hence low noise imaging also in broad daylight. Employing such a filter element therefore leads to high quantum efficiency at a target wavelength and from a low efficiency at other wavelengths. Narrowband in this context may refer to a transmission window with a spectral width of less than 50 nm, in particular less than 10 nm, wherein the target wavelength is comprised by the transmission window, e.g. the target wavelength is the center wavelength. The filter element may have more than one transmission window, e.g. a first window including 850 nm and a second window including 940 nm. The passband width of the window depends on the width of the active light source that illuminates the scene. This may be as small as 10 nm, e.g. for illumination with a vertical cavity surface emitting laser or VCSEL. Or this may be 60 nm or more, e.g. in case of illumination with light emitting diodes or other illumination sources.

In some embodiments, the filter element is configured as a Fabry-Pérot cavity.

A strongly selective filtering of the incident light before entering the pixel volume may be realized by employing a Fabry-Pérot type filter. Typically composed of two dichroic mirrors arranged at a specific distance from each other, the formed Fabry-Pérot cavity enables a narrowband filter for the incident light. As in many applications that rely on active illumination at a specific wavelength, such a narrowband filter is anyhow needed in the optical path, arranging it right above the first surface has the advantage of increasing the quantum efficiency due to the trapping of light within the pixel volume until it is absorbed and converted into an electric signal for further processing.

In some embodiments, the structured interface is arranged on a side of the pixel that comprises the first surface, or on a side of the pixel facing away from the first surface.

The pixel may be front or backside illuminated, meaning that the active region of the pixel is either located at the side of the pixel opposite to the first surface or at the side of the first surface. Likewise, depending on the manufacturing process, the structured surface, e.g. formed by a light scattering layer, may be arranged on either of the two mentioned sides of the pixel.

In some embodiments, the isolation layers cover at least part of the at least two surfaces of the semiconductor body.

For efficient light trapping within the pixel volume, the isolation layers are required to cover as much of the sides of the pixel that are perpendicular to the first surface as possible. For example, the isolation layers are realized by deep trench isolation, DTI, that covers substantially, if not all of, the entire side surfaces of the pixel's semiconductor body.

In some embodiments, the pixel further comprises isolation layers on all surfaces of the semiconductor body that are perpendicular to the first surface.

For efficient light trapping in all dimensions, isolation layers on all sides of the pixel that are perpendicular to the first surface are required. For a pixel with a square footprint, i.e. a square first surface, this means that four side surfaces need to be covered with an isolation layer. This ensures that no light can leave the pixel volume towards the side where a neighboring pixel may be arranged.

The object is further solved by an image sensor comprising a plurality of pixels according to one of the embodiments described above, wherein the pixels are arranged such that an isolation layer of each of two adjacent pixels face each other.

An image sensor with a plurality of pixels according to the improved concept, for example arranged in an array or in a matrix, allows for high sensitivity and low noise imaging at a particular target wavelength. Applications that greatly benefit from the improved concept include infrared imaging applications that rely on active illumination of an object or a scene that is to be captured. For example, these applications have identification purposes such as facial recognition, or aim at 3D imaging and sensing applications. For active illumination, the image sensor may be configured to be operated together with a light source, for example a VCSEL or a LED. The filter element of such an image sensor may be a combined filter element arranged above all pixels or each pixel may have its own filter element.

In some embodiments, the image sensor is a CMOS image sensor.

The object is further solved by an electronic device with an imaging system, such as a camera system, comprising an image sensor with pixels according to one of the aforementioned embodiments.

Conventional electronic devices typically employ a camera module for infrared imaging for identification purposes, such as facial or iris recognition. The image sensors in such devices are often extremely limited in dimension, which leads to small pixel sizes. Maintaining a high sensitivity and a large quantum efficiency of each of the pixels, the improved concept ensures that light, once entering the pixel volume, is trapped within the pixel until it is absorbed and in its active detection region, hence reducing the escaping of light. Furthermore, a filter element that is highly selective in terms of the wavelengths that are transmitted prevents light and unwanted wavelengths from being detected.

The object is further solved by a method of manufacturing a pixel, wherein the method comprises providing a semiconductor body having a first surface that is configured as an entrance surface, and a light capturing region that is configured for capturing light incident on the first surface. The method further comprises forming a structured interface, applying isolation layers on at least two surfaces of the semiconductor body that are perpendicular to the first surface, and arranging a filter element at a distance from the first surface such that light incident on the first surface at an angle of incidence smaller than a critical angle impinges on the filter element.

Further embodiments of the method become apparent to the skilled reader from the embodiments of the pixel cell described above. The following description of figures of exemplary embodiments may further illustrate and explain aspects of the improved concept. Components and parts of the pixels with the same structure and the same effect, respectively, appear with equivalent reference symbols. Insofar as components and parts of the pixel correspond to one another in terms of their function in different figures, the description thereof is not repeated for each of the following figures.

DETAILED DESCRIPTION

Figure 1:
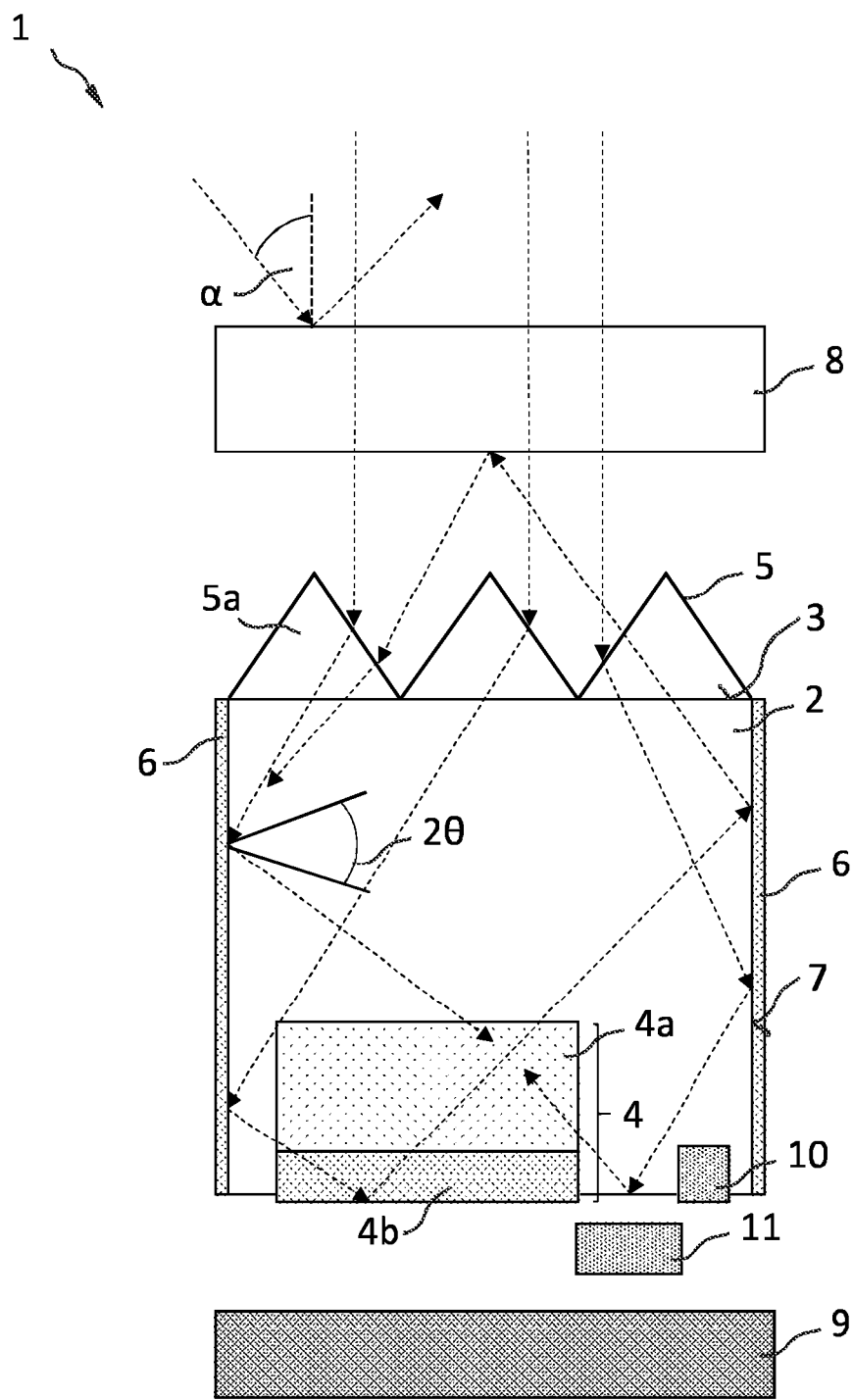
FIG. 1 schematically shows an embodiment of a pixel according to the improved concept.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein.

FIG. 1 shows an embodiment of a pixel 1 according to the proposed concept. In particular, the pixel 1 comprises a photosensitive element, such as a silicon-based photodiode 4 which is responsive to electromagnetic radiation, typically light in the visible and/or in the infrared band. The photodiode 4 is commonly realized by means differently doped regions forming a pinned photodiode composed by a junction with an n-type doped fully depletable region 4a and a p+ surface implanted pinning layer 4b. Typically, the photodiode 4 is arranged on a surface of a semiconductor body 2 or within the substrate body 2. The semiconductor body 2 may be silicon and may be a silicon substrate. The semiconductor body 2 may be p-doped. The semiconductor body 2, the photodiode implant 4a and the pinning layer 4b form two junctions that can fully deplete the area inside the photodiode 4. In this area photocarriers generated in the semiconductor body 2 are collected. The semiconductor body 2 on said surface further comprises a transfer gate 11 that connects a cathode of the photodiode 4 to a sense node 10, which typically is a floating diffusion. When opened, i.e. at the end of an exposure period, the transfer gate 11 is configured to transfer accumulated charges from the photodiode 4 to the floating diffusion FD.

The semiconductor body 2 in this embodiment further comprises a first surface 3 which acts as entrance surface for incident light. As the first surface 3 is located on the side of the semiconductor body 2 opposing the processed side, or front side, with the photodiode 4, this pixel architecture is referred to as a back-side illuminated pixel. On the first surface 3, a scattering layer 5a is arranged to form the structured interface 5, in this embodiment an interface with surface features of pyramidal shape. The scattering layer 5a may be of the same material as the semiconductor body 2, i.e. silicon, or of a different material, e.g. silicon dioxide. The structured interface constitutes the transition between the pixel volume, in this embodiment formed by the semiconductor body 2 and the scattering layer 5a, and the medium above the structured interface 5, which is air, for example. The structured interface 5 is configured to manipulate the angle of incidence a under which light enters the pixel volume with respect to the first surface 3. Typically, a pixel 1, and therefore the first surface 3, is directed towards a light source or an illuminated object resulting in a small angle of incidence α close to 0°. The side surfaces 7 of the pixel 1 that are perpendicular to the first surface 3 are covered with isolation layers 6. Choosing a material of the isolation layers 6 that has a smaller refractive index than that of the semiconductor body results in a small cut-off angle θ above which total internal reflection occurs. If the material of the semiconductor body is silicon with a refractive index of 3.5 and the material of the isolation layer is silicon dioxide with a refractive index of 1.45, the cut-off angle θ is approximately 24°. Refractive indices throughout this disclosure refer to the refractive index with respect to a respective target wavelength. Appropriately adjusting the cut-off angle θ and the exact shape of the structured interface 5 ensures efficient light trapping within the pixel volume and therefore an increased quantum efficiency of the pixel 1 as light may not be absorbed instantaneously. The isolation layers 6 may be trenches that separate the pixel 1 from neighboring pixels.

As under certain circumstances light after entering the pixel volume through the first surface may escape through the same without being absorbed, a filter element 8 is placed at a distance from the first surface 3. Considering the topography of the structured interface 5, the filter element 8 ideally is arranged as close as possible to the first surface 3. As illustrated, the filter element 8 is configured to transmit light incident on the filter element at an angle of incidence α smaller than a predetermined critical angle αc, which may be close to 0°, for example. Light incident at an angle α equal to or larger than the critical angle αc is on the contrary reflected in order to prevent the detection of unwanted background light, for instance. This may be realized by an angle-dependent transmission of the filter element 8. A further purpose of the filter element 8 is to act as an effective one-way mirror and to reflect light that has escaped from the pixel volume through the first surface 3, and hence the structured interface 5. Due to the fact that the structured interface 5 in combination with the isolation layers 6 modify the angle with which the light impinges on the filter element 8 in this case, this effect may be realized by the angular dependency of the transmission of the filter element 8. For example, the filter element 8 is a dichroic filter.

Furthermore, the transmission of the filter element 8 may be also wavelength-dependent. In order to not only filter, i.e. reflect, light that impinges on the filter at an angle of incidence α larger than the critical angle αc but also to filter light of unwanted wavelengths, the filter may be configured to transmit only light of certain wavelength. This may likewise be realized by a dichroic filter, for example by means of alternating layers of different refractive indices that are tuned with respect to their thickness and/or materials. Tuning the filter to be transmissive only for narrowband ranges around 850 nm and/or 940 nm, for example, is a suitable tool to further enhance the quantum, i.e. detection, efficiency particularly in daylight as the sunlight shows dips in its spectrum at these wavelengths due to absorption in the atmosphere. Narrowband in this context may refer to a transmission window with a spectral width of less than 50 nm, in particular less than 10 nm, wherein the target wavelength is comprised by the transmission window, e.g. the target wavelength is the center wavelength of the transmission window. The filter element 8 may have more than one transmission window, e.g. a first window including 850 nm and a second window including 940 nm. To achieve narrowband transmission, in particular 10 nm or less, a Fabry-Pérot structure may be used for the filter. This structure comprises two dichroic mirrors with a dielectric in between, tuned to a thickness optimized for the transmission wavelength.

At the side with the photodiode 4, the pixel 1 may further comprise a metal reflector 9 which is configured to reflect any light back into the pixel volume that has escaped from the semiconductor body 2 through the surface with the photodiode 4. The reflector can also be non-metal, any other type of reflector, such as silicon on top of silicon oxide, for example.

Figure 2:
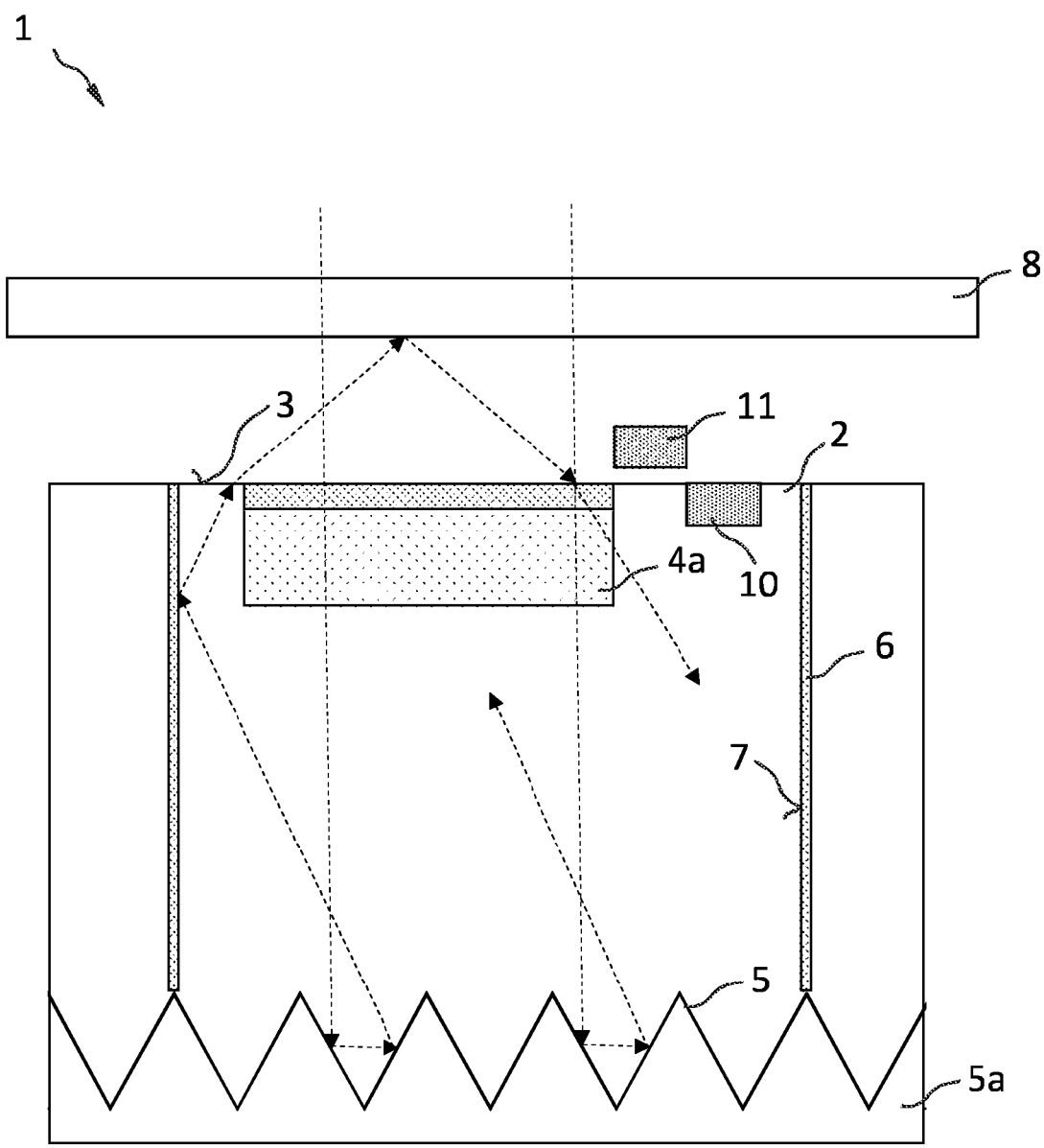
FIG. 2 schematically shows a further embodiment of a pixel according to the improved concept.

FIG. 2 shows a further embodiment of a pixel 1, which is configured as a front-side illuminated pixel. In contrast to the embodiment shown in FIG. 1, the first surface, which is configured as the entrance surface, is arranged on the side of the semiconductor body that comprises the photodiode 4. A further difference to the previous embodiment is the arrangement of the scattering layer 5a to form the structured interface 5. In this embodiment, the scattering layer 5a is arranged on the back-side of the semiconductor body 2. For example, during a processing step a surface of the semiconductor body 2 is patterned and structured to form the pyramidal structures and the scattering layer 5a is applied to this processed surface. Therefore, contrary to the embodiment of FIG. 1, in this embodiment, the incident light first enters and traverses the semiconductor body through the first surface 3 before impinging on the structured interface 5, where the light is deflected. For example, the scattering-layer 5a is a dioxide with a refractive index different than that of the semiconductor body, which may be silicon.

The isolation layers 6 are realized as trenches that extend from the first surface 3 in a perpendicular direction towards the scattering-layer 5a. For example, the trenches extend all the way to the structured interface 5. The trenches during fabrication are filled with an isolation material, for example an oxide such as silicon dioxide, which is characterized by a refractive index smaller than that of a material of the semiconductor body 2. The isolation achieved by means of the filled trenches as described are typically referred to as deep trench isolation, DTI An advantage of this front-side illuminated pixel architecture is that the filter-element 8 may be placed at a significantly smaller distance from the first surface 3 compared to the embodiment illustrated in FIG. 1. However, a back-side illuminated pixel may have other advantages such as a more straight-forward fabrication process, a smaller overall pixel structure, less routing constraints for interconnects on top of the pixel and/or a smaller bill of materials, for instance.

Figure 3:
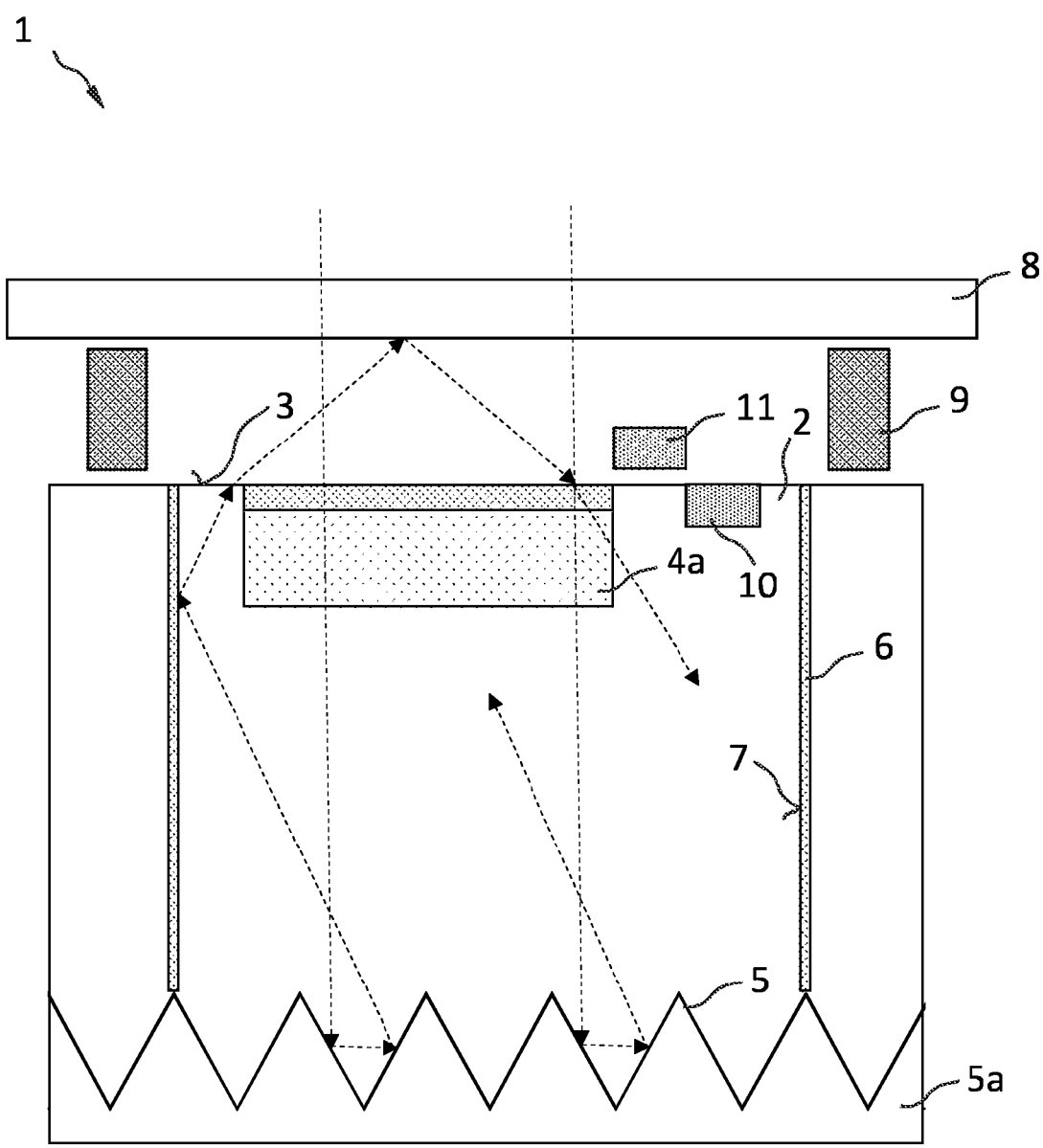
FIG. 3 schematically shows a further embodiment of a pixel according to the improved concept.

FIG. 3 shows a further embodiment of a pixel 1 according to the improved concept. The embodiment shown is based on that described in FIG. 2 and further comprises a metal reflector 9 arranged in a gap between the filter element 8 and the first surface 3. The metal reflector 9 may be a single metal reflector or comprise multiple elements. The metal reflector 9 is arranged such that at least part of the perimeter of the pixel 1 is surrounded by the metal reflector 9. The perimeter in this context is defined by the delimitation of the first surface 3 by means of the isolation layers 6.

Figure 4:
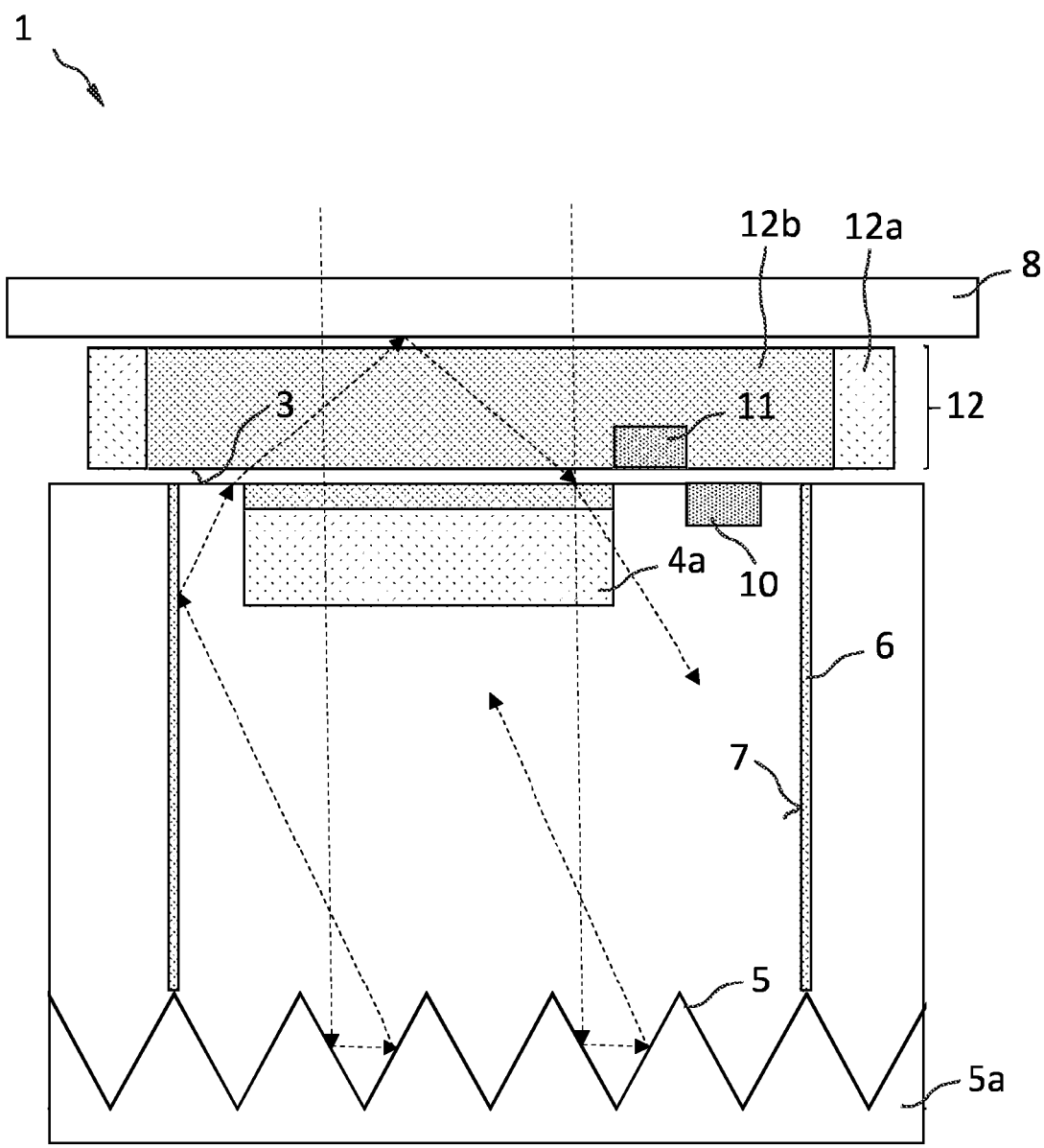
FIG. 4 schematically shows a further embodiment of a pixel according to the improved concept.

FIG. 4 shows a further embodiment of a pixel 1 according to the improved concept. The embodiment shown is based on that described in FIG. 2 and further comprises a waveguide structure 12 arranged in the gap between the first surface 3 and the filter element 8. The waveguide structure for example comprises a cladding 12a of a material with a first refractive index and a core 12b of a material with a second refractive index that is larger than the first refractive index. The cladding 12a, like the metal reflector 9 of the embodiment shown in FIG. 3, is arranged such that at least part, if not all, of the perimeter of the pixel 1 is surrounded by the cladding 12a.

Figure 5:
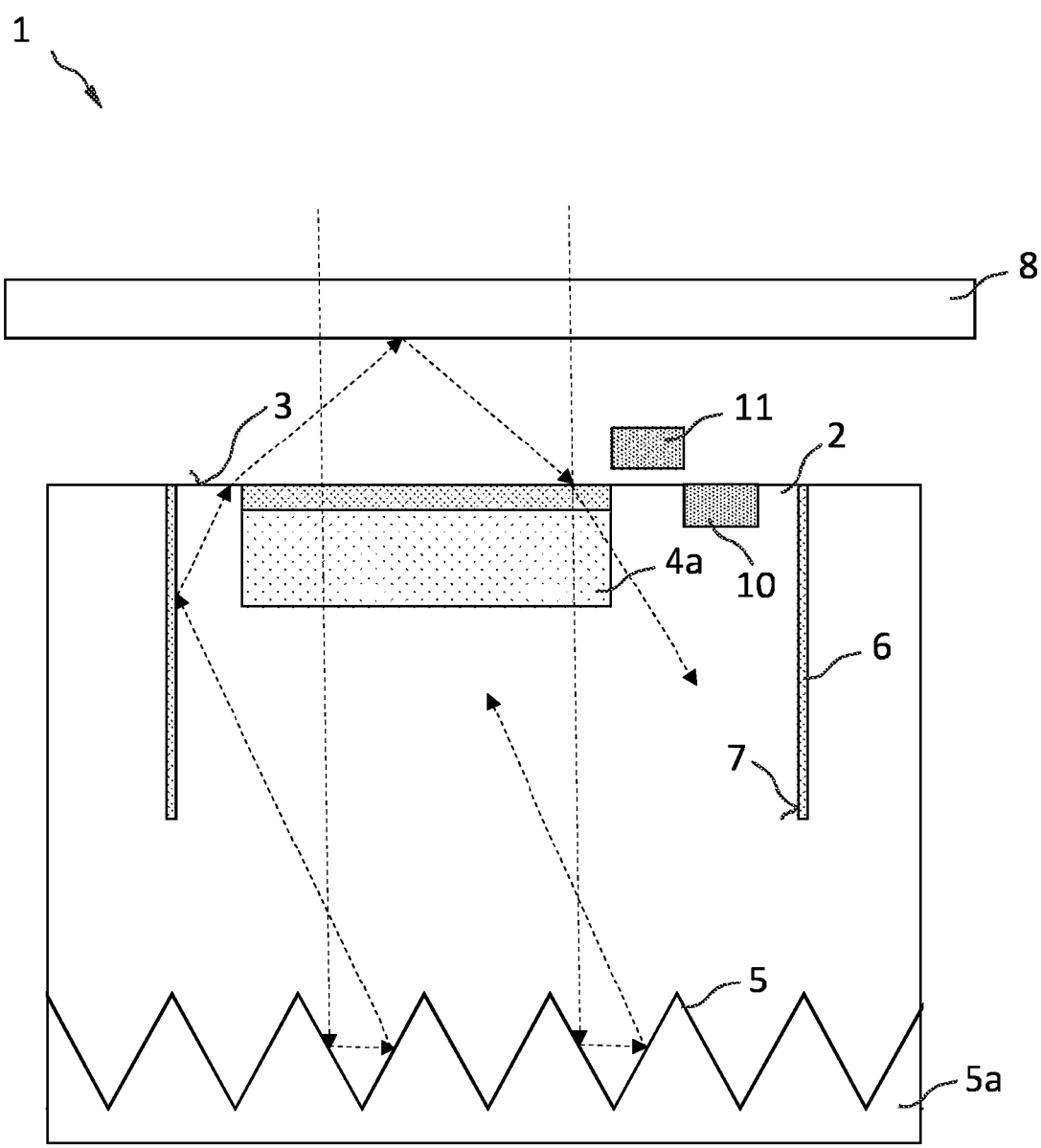
FIG. 5 schematically shows a further embodiment of a pixel according to the improved concept.
Figure 6:
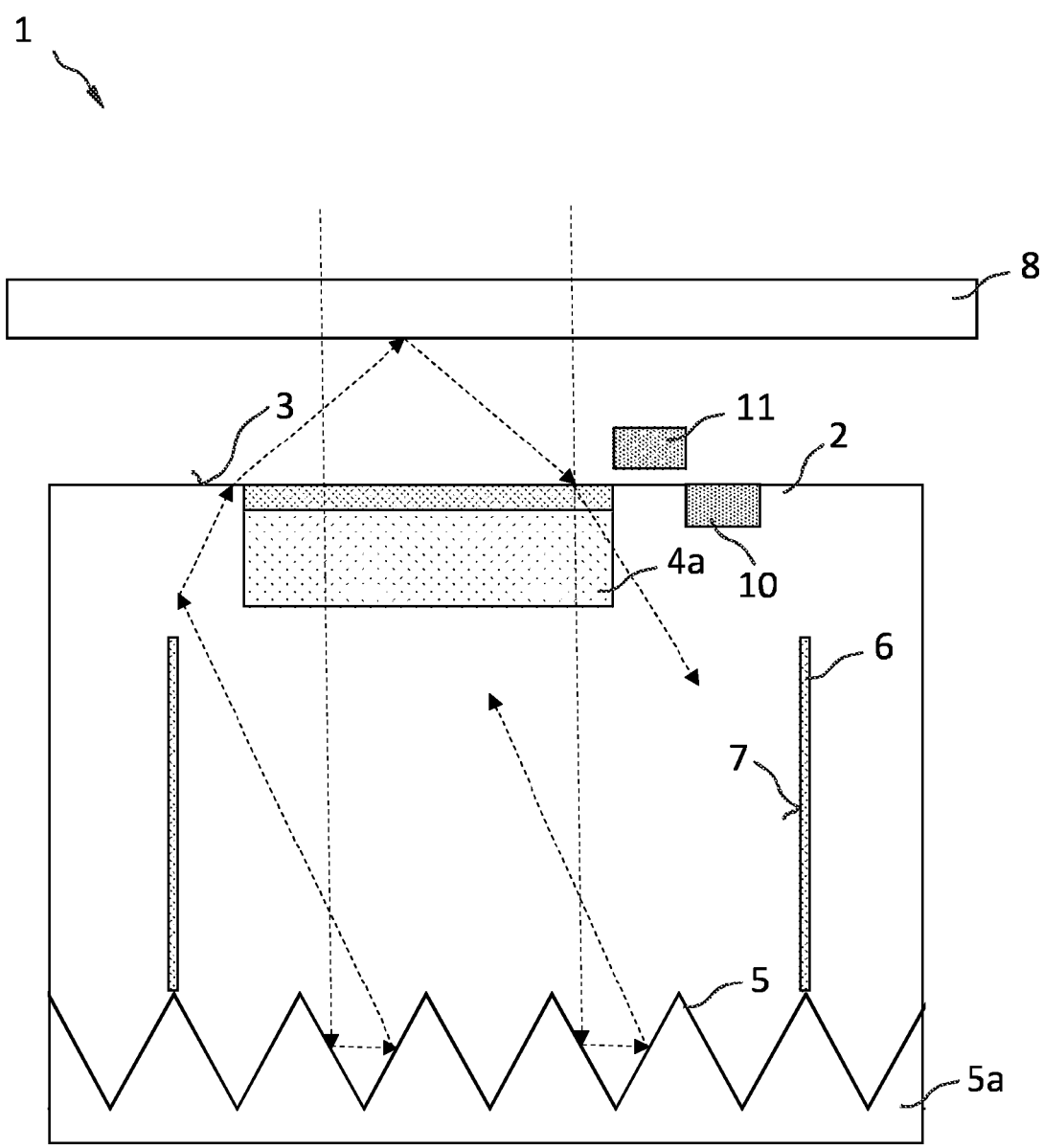
FIG. 6 schematically shows a further embodiment of a pixel according to the improved concept.

FIGS. 5 and 6 show further embodiments of a pixel 1 according to the improved concept. Both these embodiments are based on that described in FIG. 2 and illustrate the isolation layers 6 extending only partially along the side of the semiconductor body 2 that is perpendicular to the first surface 3. In FIG. 5, the isolation layers 6 are shown to extend from the first surface 3 towards the side opposing the first surface 3 by a predefined length. Analogous to this, FIG. 6 illustrates the case in which the isolation layers 6 extend from a side opposing the first surface 3 towards the first surface 3 by a predefined length. The isolation layers 6 in this case may be referred to as partial frontside DTI or backside DTI, respectively, and may suffice to achieve the desired enhancement of the light trapping and hence the enhanced quantum efficiency, while at the same time keeping the fabrication process simple and efficient.

The combination of the structured interface 5, the isolation layers 6 and the filter element 8, as shown in the embodiments in FIGS. 1 to 4, lay the foundation for the working principle of the present disclosure, in which incident light of a target wavelength is trapped within the pixel volume ideally until it is absorbed by the light-capturing region 4a of a photosensitive element such as a photodiode 4. Appropriately designing the aforementioned elements with respect to shape, material and dimensions ensures an efficient detection of incident light of a target wavelength while rejecting light of unwanted wavelengths at the same time. This leads to a significantly increased quantum efficiency of a pixel 1, and therefore of an image sensor comprising a plurality of pixels according to the improved concept, as detailed throughout the description.

The invention claimed is:

1. A pixel comprising:
a semiconductor body having a first surface configured as an entrance surface and a light-capturing region configured for capturing light incident on the first surface;
a structured interface;
isolation layers on at least two surfaces of the semiconductor body that are perpendicular to the first surface; and
a filter element arranged at a distance from the first surface such that light incident on the first surface at an angle of incidence smaller than a critical angle impinges on the filter element, wherein the filter element is configured
to reflect light if the angle of incidence is larger than the critical angle; and
to transmit light if the angle of incidence is less than or equal to the critical angle.

2. The pixel according to claim 1, wherein the filter element is arranged such that the light incident at the angle of incidence smaller than the critical angle has to traverse the filter element before entering the semiconductor body.

3. The pixel according to claim 1, wherein a transmission value of the filter element depends on the angle of incidence and/or on a wavelength of the light.

4. The pixel according to claim 1, wherein the filter element comprises a dichroic filter.

5. The pixel according to claim 4, further comprising a waveguide structure arranged between the filter element and the first surface.

6. The pixel according to claim 1, wherein the filter element is configured to transmit light at optical wavelengths within a specific narrowband wavelength range.

7. The pixel according to claim 1, wherein the filter element is configured as a Fabry-Perot cavity.

8. The pixel according to claim 1, wherein the structured interface is arranged
on a side of the pixel that comprises the first surface; or
on a side of the pixel facing away from the first surface.

9. The pixel according to claim 1, wherein the isolation layers cover at least part of the at least two surfaces of the semiconductor body.

10. The pixel according to claim 1, further comprising isolation layers on all surfaces of the semiconductor body that are perpendicular, to the first surface.

11. An image sensor comprising a plurality of pixels according to claim 1, wherein the pixels are arranged such that an isolation layer of each of two adjacent pixels face each other.

12. The image sensor of claim 11, wherein the image sensor is a CMOS image sensor.

13. The image sensor according to claim 11, wherein the image sensor is operated in combination with active illumination.

14. An electronic device with a camera system comprising an image sensor according to claim 11.

15. The pixel according to claim 1, wherein the filter element is configured to transmit light at optical wavelengths within a wavelength range comprising 940 nm and/or 850 nm.

16. The image sensor according to claim 11, wherein image sensor is operated in combination with active illumination in an infrared wavelength range.

17. A method of manufacturing a pixel, the method comprising:
providing a semiconductor body having a first surface that is configured as an entrance surface, and a light-capturing region that is configured for capturing light incident on the first surface;
forming a structured interface;
applying isolation layers on at least two surfaces of the semiconductor body that are perpendicular to the first surface; and
arranging a filter element at a distance from the first surface such that light incident on the first surface at an angle of incidence smaller than a critical angle impinges on the filter element, wherein the filter element is configured
to reflect light if the angle of incidence is larger than the critical angle; and
to transmit light if the angle of incidence is less than or equal to the critical angle.

18. The method according to claim 17, wherein the filter element is arranged such that the light incident at the angle of incidence smaller than the critical angle has to traverse the filter element before entering the semiconductor body.

19. A pixel comprising:
a semiconductor body having a first surface configured as an entrance surface and a light-capturing region configured for capturing light incident on the first surface;
a structured interface formed by a light scattering layer on a surface of the semiconductor body;
isolation layers on at least two surfaces of the semiconductor body that are perpendicular to the first surface; and
a filter element arranged at a distance from the first surface such that light incident on the first surface at an angle of incidence smaller than a critical angle impinges on the filter element.

* * * * *